(12) United States Patent
Loopstra et al.

(10) Patent No.: US 6,765,218 B2
(45) Date of Patent: *Jul. 20, 2004

(54) LITHOGRAPHIC PROJECTION APPARATUS WITH POSITIONING SYSTEM FOR USE WITH REFLECTORS

(75) Inventors: Erik R. Loopstra, Heeze (NL); Antonius J. J. van Dijsseldonk, Hapert (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 10/385,444

(22) Filed: Mar. 12, 2003

(65) Prior Publication Data

US 2003/0168615 A1 Sep. 11, 2003

Related U.S. Application Data

(63) Continuation of application No. 09/722,398, filed on Nov. 28, 2000, now Pat. No. 6,593,585.

(30) Foreign Application Priority Data

Nov. 30, 1999 (EP) .............................. 99204043

(51) Int. Cl.[7] .............................. G03F 9/00; H01J 37/30
(52) U.S. Cl. .............................. 250/492.1; 250/492.2; 250/492.22; 250/442.11; 250/492.24; 250/504 R; 250/365; 250/372; 430/395; 430/296
(58) Field of Search .......................... 250/492.1, 492.2, 250/492.22, 442.11, 504 R, 365, 372; 430/395, 296

(56) References Cited

U.S. PATENT DOCUMENTS

| | | | |
|---|---|---|---|
| 3,015,990 A | 1/1962 | Jonkers | 88/96 |
| 3,334,959 A | 8/1967 | Walsh | 350/310 |
| 3,588,230 A | 6/1971 | De Rieux | 350/252 |
| 3,588,232 A | 6/1971 | Mostel | 350/288 |
| 4,023,891 A | 5/1977 | Chadwick | 350/288 |
| 4,268,123 A | 5/1981 | Mesco | 350/310 |
| 4,420,223 A | 12/1983 | Watanabe et al. | 350/310 |
| 4,533,100 A | 8/1985 | Paseri | 244/158 R |
| 4,569,248 A | 2/1986 | Hug | 74/581 |
| 4,681,408 A | 7/1987 | Ahmad et al. | 350/609 |
| 4,726,671 A | 2/1988 | Ahmad et al. | 350/633 |
| 5,420,436 A | 5/1995 | Seya et al. | |
| 5,448,612 A | 9/1995 | Kasumi et al. | |
| 6,362,871 B1 | 3/2002 | Bleeker | 355/69 |
| 6,396,067 B1 * | 5/2002 | Braat | 250/492.2 |
| 6,410,928 B1 | 6/2002 | Verhoeven et al. | 250/492.2 |
| 6,421,573 B1 | 7/2002 | Kafka et al. | 200/121 |
| 6,593,585 B1 * | 7/2003 | Loopstra et al. | 250/492.24 |

FOREIGN PATENT DOCUMENTS

| | | |
|---|---|---|
| DE | 29 03 804 | 8/1980 |
| EP | 0 744 641 A2 | 11/1996 |
| JP | 8-298239 | 11/1996 |
| JP | 2000-31048 | 1/2000 |

* cited by examiner

*Primary Examiner*—Nikita Wells
(74) *Attorney, Agent, or Firm*—Pillsbury Winthrop LLP

(57) ABSTRACT

In a lithographic projection apparatus the positions and/or orientations of reflective optical elements is dynamically controlled. The position of a reflective optical element such as a mirror in an illumination or projection system is first measured using an absolute position sensor mounted on a reference frame and thereafter measured by a relative position sensor also mounted on said reference frame. The position of the element is controlled in accordance with the measured position, e.g. to maintain it stationary in spite of vibrations that might otherwise disturb it. The absolute sensor may be a capacitive or inductive sensor and the relative sensor may be an interferometer.

56 Claims, 2 Drawing Sheets

LITHOGRAPHIC PROJECTION APPARATUS WITH POSITIONING SYSTEM FOR USE WITH REFLECTORS

CROSS-REFERENCE TO RELATED APPLICATIONS

This application is a continuation of U.S. patent application Ser. No. 09/722,398, filed Nov. 28, 2000 and issued as U.S. Pat. No. 6,593,585 B1 an Jul. 15, 2003. The entire contents of that application are incorporated herein by reference.

BACKGROUND OF THE INVENTION

1. Field of the Invention

The present invention relates to lithographic projection apparatus comprising an illumination system for supplying a projection beam of radiation; a first object table for holding a mask; a second object table for holding a substrate; and a projection system for imaging an irradiated portion of the mask onto a target portion of the substrate.

2. Description of Related Art

For the same of simplicity, the projection system may hereinafter be referred to as the "lens"; however, this term should be broadly interpreted as encompassing various types of projection systems, including refractive optics, reflective optics, and catadioptric systems, for example. The illumination system may also include elements operating according to any of these principles for directing, shaping or controlling the projection beam of radiation, and such elements may also be referred to below, collectively or singularly, as a "lens". In addition, the first and second object tables may be referred to as the "mask table" and the "substrate table", respectively. The mask table should be taken as any structure or device that may or does hold another structure or device, generally referred to as a mask, in which a pattern to be imaged is or can be formed. Further, the lithographic apparatus may be of a type having two or more mask tables and/or two or more substrate tables. In such "multiple stage" devices the additional tables may be used in parallel, or preparatory steps may be carried out on one or more stages while one or more other stages are being used for exposures.

Lithographic projection apparatus can be used, for example, in the manufacture of integrated circuits (ICs). In such a case, the mask (reticle) may contain a circuit pattern corresponding to an individual layer of the IC, and this pattern can be imaged onto a target area (comprising one or more dies) on a substrate (silicon wafer) which has been coated with a layer of radiation-sensitive material (resist). In general, a single wafer will contain a whole network of adjacent target areas which are successively irradiated via the mask, one at a time. In one type of lithographic projection apparatus, each target area is irradiated by exposing the entire mask pattern onto the target area at once; such an apparatus is commonly referred to as a wafer stepper. In an alternative apparatus—which is commonly referred to as a step-and-scan apparatus—each target area is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally<1), the speed V at which the substrate table is scanned will be a factor M times that at which the mask table is scanned. More information with regard to lithographic devices as here described can be gleaned from International Patent Application WO 97/33205.

In general, apparatus of this type contained a single first object (mask) table and a single second object (substrate) table. However, machines are becoming available in which there are at least two independently movable substrate tables; see, for example, the multi-stage apparatus described in International Patent Applications WO 98/28665 and WO 98/40791. The basic operating principle behind such multi-stage apparatus is that, while a first substrate table is underneath the projection system so as to allow exposure of a first substrate located on that table, a second substrate table can run to a loading position, discharge an exposed substrate, pick up a new substrate, perform some initial metrology steps on the new substrate, and then stand by to transfer this new substrate to the exposure position underneath the projection system as soon as exposure of the first substrate is completed, whence the cycle repeats itself; in this manner, it is possible to achieve a substantially increased machine throughout, which in turn improves the cost of ownership of the machine.

To reduce the size of features that can be imaged, it is desirable to reduce the wavelength of the illumination beam. To such end, it has been proposed to use wavelengths of less than about 200 nm, for example 193 nm, 157 nm or 126 nm. Further reductions in the wavelength of the illumination radiation, e.g to about 10 to 20 nm, are also envisaged. Such wavelengths in particular are more conveniently focused and controlled by reflective optics, such as mirrors. However, mirrors in lithography apparatus must be positioned to especially high accuracy, as compared to refractive elements, because any rotational orientation errors are magnified by the total downstream optical path length. In an apparatus using very short wavelength radiation, the optical path length may be of the order of 2 m or more.

For example, to have a good overlay performance, it can be necessary to keep the position of an image of the irradiated portion of the mask stable at a given position at substrate level with an error (e) of less than about 1 nm (see FIG. 3 of the accompanying drawings). If the distance between the mirror and the substrate (W) is 2 m the maximum permissible rotational error of the reflected beam, to keep the system within specification, is $28 \times 10^{-9}$ degrees ($1 \times 10^{-9}$ m/2 m=tan $28 \times 10^{-9}$). Since, for a mirror, the angle of reflection equals the angle of incidence, a rotational error (da) in the position of the mirror will give rise to twice as large an error in the direction of the reflected beam. Thus the mirror must be positioned with an accuracy of $14 \times 10^{-9}$ degrees or better. If the mirror has a width of order 0.1 m and a rotating point at one side, that rotating point must be positioned to within 0.024 nm (tan $14 \times 10^{-9} \times 0.1 = 2.4 \times 10^{-11}$). Clearly the accuracy with which such a mirror must be orientated is extremely high and will only increase as the specification for image accuracy increases. The accuracy requirements for position in X, Y and Z are less demanding as such errors are magnified less at substrate level.

SUMMARY OF THE INVENTION

It is an object of the present invention to provide a lithographic projection apparatus having an improved positioning system to accurately and dynamically position a mirror in the radiation or projection systems.

According to a first aspect of the present invention, there is provided a lithographic projection apparatus including an illumination system constructed and arranged to supply a projection beam of radiation; a first object table constructed and arranged to hold a mask; a second object table constructed and arranged to hold a substrate; and a projection system constructed and arranged to image an irradiated portion of the mask onto a target portion of the substrate, wherein at least one of said illumination system and said projection system comprises one or more reflective optical elements and positioning means for dynamically controlling a position and/or orientation of one or more of said reflective optical elements.

The one or more reflective optical elements may comprise a single element such as a mirror, a reflective grating, a reflective filter, etc. or a combination of such elements with or without other types of element. With the invention, the position of the reflective optics is controlled continuously or repeatedly during operation of the apparatus and the effects of vibrations and mechanical shocks, and thermal and mechanical drift thereby can be mitigated.

Preferably, the projection apparatus further comprises sensing means constructed and arranged to determine a change in position and/or orientation of one or more of said reflective optical elements, and to output one or more position signals indicative thereof; and said positioning means comprises drive means constructed and arranged to change a position and/or orientation of one or more of said reflective optical elements in response to a drive control signal; and a controller responsive to said one or more position signals for generating said drive control signal so as to correct for said determined change in position and/or orientation of one or more of said reflective optical elements.

In a preferred embodiment of the invention, the lithographic apparatus includes a reference frame and sensing means for determining the position of said reflective optics relative to said reference frame.

Also preferably, the sensing means includes an absolute position sensing means constructed and arranged to measure a position and/or orientation of one of said reflective optical elements and to output an absolute position signal indicative thereof; and a relative position sensing means constructed and arranged to measure changes in said position and/or orientation of said one reflective optical element and to output a relative position signal indicative thereof. Said drive means may be arranged to change said position and/or orientation of said one reflective optical element in response to said drive control signal; and said controller may be responsive to said absolute and relative position signals for generating said drive control signal so as to set and maintain said one reflective optical element in a desired position and/or orientation.

By the use of both absolute position sensing means, which can determine the absolute position and/or orientation of the reflective optics without calibration each time the apparatus is initialized, and relative position sensing means, which can detect movements in the position and/or orientation of the reflective optics with a high bandwidth and/or larger measuring range, the positioning system can accurately position, or stabilize, the reflective optics without a lengthy calibration or initialization procedure, and counteract any vibrations in the reflective optics. After an initial position determination using the absolute sensing means, the drive means are controlled primarily on the basis of the high frequency output from the relative sensing means or interferential encoders.

The absolute sensing means preferably include one or more capacitive or inductive sensors and the relative position sensing means preferably include one or more interferometers.

In yet another preferred embodiment said sensing means is constructed and arranged to direct a sensing beam of radiation separate from said projection beam along said one or more reflective optical elements; and to determine a position of said sensing beam when having been reflected by said one or more reflective optical elements.

According to yet a further aspect of the invention there is provided a method of manufacturing a device using a lithographic projection apparatus comprising an illumination system constructed and arranged to supply a projection beam of radiation; a first object table constructed and arranged to hold a mask; a second object table constructed and arranged to hold a substrate; and a projection system constructed and arranged to image an irradiated portion of the mask onto a target portion of the substrate; the method comprising the steps of providing a mask bearing a pattern to said first object table; providing a substrate provided with a radiation-sensitive layer to said second object table; irradiating portions of the mask and imaging said irradiated portions of the mask onto said target portions of said substrate; and dynamically controlling a position and/or orientation of one or more reflective optical elements comprised in one of said illumination and projection systems.

In a manufacturing process using a lithographic projection apparatus according to the invention a pattern in a mask is imaged onto a substrate which is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallisation, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target area", respectively.

In the present document, the terms "radiation" and "beam" are used to encompass all types of electromagnetic radiation, including, for example, ultraviolet radiation, EUV and X-rays. Also, the terms "mirror" and "reflector" are used synonymously and, unless the context otherwise determines, are intended to encompass any reflective element, whether wholly, partially or selectively reflective and whether or not it has any other optical, e.g. refractive or diffractive, properties. Where the context allows, the term may also apply to non-specular reflectors such as scatter plates. The term position should be interpreted broadly as referring to any or all of the X, Y, and Z positions and rotational positions Rx, Ry and Rz.

BRIEF DESCRIPTION OF THE DRAWINGS

The present invention will be described below with reference to exemplary embodiments and the accompanying schematic drawings, in which like parts are indicated by like references, and in which.

DETAILED DESCRIPTION OF THE INVENTION

Embodiment 1

Figure 1:
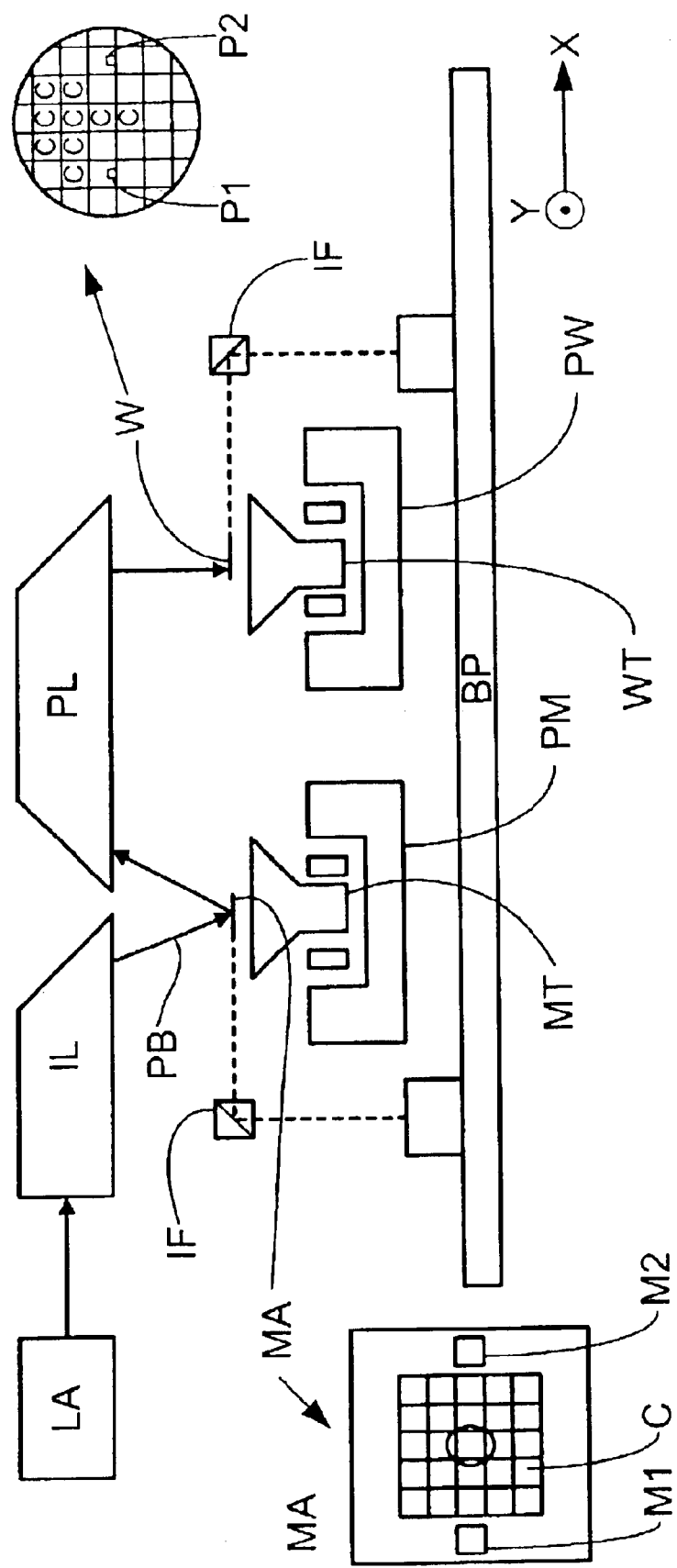
FIG. 1 depicts a lithographic projection apparatus according to the invention.

FIG. 1 schematically depicts a lithographic projection apparatus according to the invention. The apparatus comprises:

- a radiation system LA, IL for supplying a projection beam PB of radiation (e.g. UV or EUV radiation);
- a first object table (mask table) MT provided with a mask holder for holding a mask MA having alignment marks M1, M2 (e.g. a reticle), and connected to first positioning means PM for accurately positioning the mask with respect to item PL;
- a second object table (substrate table) WT provided with a substrate holder for holding a substrate W having alignment marks P1, P2 (e.g. a resist-coated silicon wafer), and connected to second positioning means PW for accurately positioning the substrate with respect to item PL;
- a projection system ("lens") PL (e.g. a reflective or catadioptric system) for imaging an irradiated portion of the mask MA onto a target area, or portion, C of the substrate W.

The radiation system comprises a source LA (e.g. a Hg lamp, an excimer laser, a laser or discharge plasma source, or an undulator provided around the path of an electron beam in a storage ring or synchrotron) which produces a beam of radiation. This beam is passed along various optical components included in illumination system IL so that the resultant beam PB is collected in such a way as to give a desired illumination profile at the entrance pupil and the mask.

The beam PB subsequently impinges upon the mask MA which is held in a mask holder on a mask table MT. Having been selectively reflected by the mask MA, the beam PB passes through the lens PL, which focuses the beam PB onto a target area C of the substrate W. With the aid of the interferometric displacement measuring means IF and the second positioning means PW, the substrate table WT can be moved accurately, e.g. so as to position different target areas C in the path of the beam PB. Similarly, the interferometric displacement measuring means IF and the first positioning means PM can be used to accurately position the mask MA with respect to the path of the beam PB. In general, movement of the object tables MT, WT can be realized with the aid of a long-stroke module (course positioning) and a short stroke module (fine positioning), which are not explicitly depicted in FIG. 1.

The depicted apparatus can be used in two different modes:

1. In step mode, the mask table MT is kept essentially stationary, and an entire mask image is projected in one go (i.e. a single "flash") onto a target area C. The substrate table WT is then shifted in the x and/or y directions so that a different target area C can be irradiated by the beam PB;
2. In scan mode, essentially the same scenario applies, except that a given target area C is not exposed in a single "flash". Instead, the mask table MT is movable in a given direction (the so-called "scan direction", e.g. the x direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target area C can be exposed, without having to compromise on resolution.

Although the present embodiment employs a reflective mask, it will be immediately appreciated that the present invention may also be used in lithographic apparatus having transmissive masks. The depicted embodiment also employs reflective elements in the radiation and projections systems, however some refractive elements may also be used.

Figure 2:
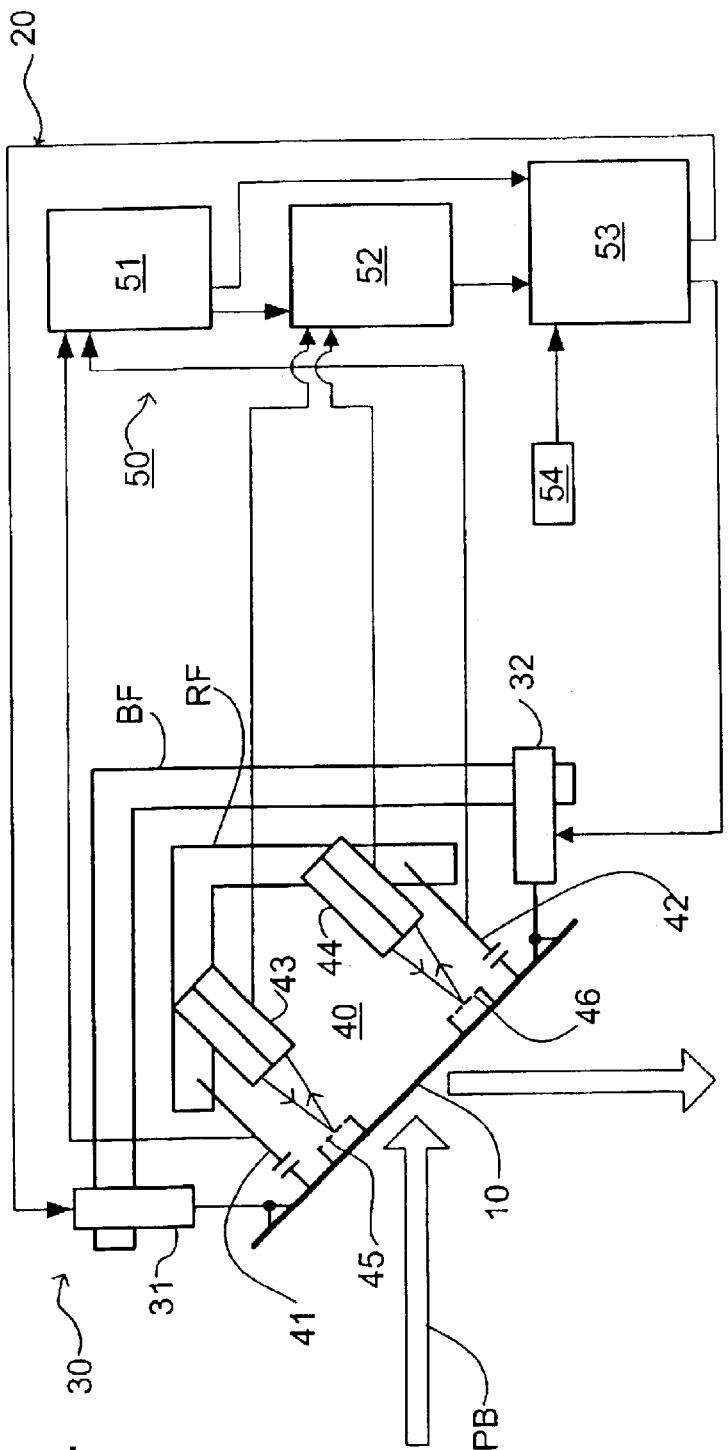
FIG. 2 is a diagram of a positioning system for a mirror according to a first embodiment of the invention.
Figure 3:
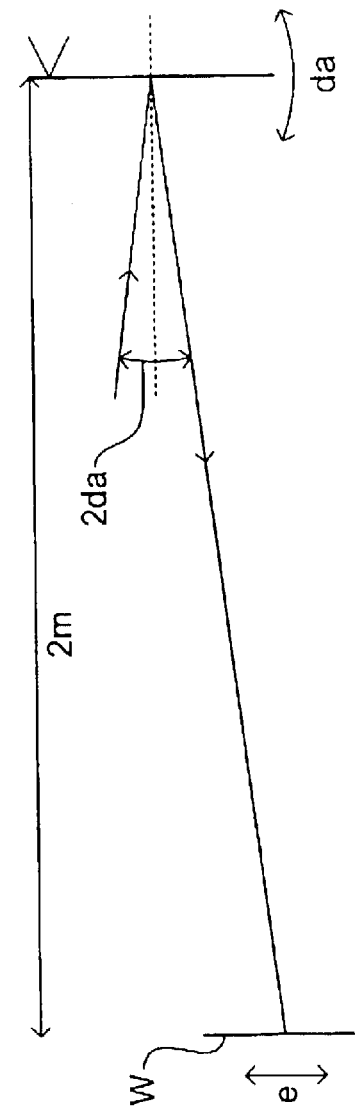
FIG. 3 is a diagram used in explaining the effect of rotational errors in mirror position on image position at substrate.

FIG. 2 illustrates one of the mirrors 10 included in the illumination optics IL or projection optics PL and its associated positioning system 20, which comprises drive system 30, position sensing system 40 and control system 50. Mirror 10 is depicted for clarity as a flat mirror set at an acute angle to the incident radiation PB. However, it will be appreciated that mirror 10 may be a glancing incidence mirror and may be macro- or microscopically shaped to effect any desired shaping or focusing of the radiation beam PB.

As shown in FIG. 2, mirror 10 is mounted on drives 31, 32 which form part of the positioning system 30 and which in turn are mounted on base frame BF. Base frame BF is desirably very solid and may be attached to, or part of, the base plate BP of the lithographic apparatus 1, for example. Drives 31, 32 are used to accurately control the position, and particularly the orientation, of the mirror. For clarity, only two drives are illustrated in FIG. 2 but it will be appreciated that more or fewer drives may be provided to control the position of the mirror in any or all of the six degrees of freedom.

In the present embodiment the drives 31, 32 comprise Lorentz-force motors, of which the general working principle, for instance, is disclosed in European patent application EP 1 001 512 and equivalent U.S. patent application Ser. No. 09/435,638, which are incorporated herein by reference. Other suitable actuators or motors having a low stiffness and the necessary responsiveness and power may also be employed.

The sensing system 40 comprises absolute sensors 41, 42 and relative sensors 43, 44, all of which are mounted on reference frame RF. Reference frame RF is a very stiff frame which is supported by air mounts, springs, or other vibration isolating means and forms the reference for the coordinate system of the apparatus. Reference frame RF may be part of or connected to reference frames used in other parts of the apparatus. It is important that reference frame RF is isolated from vibrations in the base frame BF, which may be induced, for example, by the operation of the drives 31, 32.

Absolute sensors 41, 42 measure the absolute position of the mirror 10 in one or more degrees of freedom, without the need for calibration before each use. Calibration on initial manufacturing of the apparatus and at periodic maintenance may be necessary or desirable but the absolute sensors should be able to operate for a fabrication run or series of runs without calibration. In the present embodiment the absolute sensors are capacitive sensors or inductive sensors of known type. Two absolute sensors are illustrated for the purpose of clarity, but more or fewer may be employed as necessary to provide position information in the desired degrees of freedom.

Relative sensors 43, 44 measure movement, i.e. changes in position and/or orientation, of the mirror and so would require calibration, involving the mirror being accurately set at a pre-determined position, before being usable to determine the absolute position of the mirror. In the present embodiment, relative sensors 43, 44 are interferometer-based sensors which measure the position of respective reference gratings 45, 46 mounted on the mirror 10. As with the absolute sensors, more or fewer than two sensors may be employed as required.

The interferometer sensors 43, 44 are capable of measuring movements of the mirror with a higher sensitivity and/or bandwidth and/or range than the capacitive or inductive sensors 41, 42 and therefore are used to provide continual relative position signals during operation of the apparatus. The absolute sensors 41, 42 are used to provide absolute position signals during initial setup of the apparatus and when re-initializing the apparatus after any period when the projection or illumination systems were not operating. They may also be used periodically to verify or recalibrate the interferometer sensors 43, 44.

Raw signals from the absolute sensors 41, 42 and the relative sensors 43, 44 are provided to respective first and second signal processing circuits 51, 52 forming part of the control system 50. The signal processing circuits 51, 52 perform appropriate processing and verification of the signals provided by the sensors and transform them as necessary to an appropriate coordinate system for output. The processed position signals from the first signal processing circuit 51, representing the absolute position of the mirror 10, may be provided to the second signal processing circuit 52 for calibration of the relative position signals. A motor control circuit 53 receives the processed position signals from signal processing circuits 51, 52 and also set point data from set point circuit 54 and determines appropriate drive signals which are provided to motors 31, 32 to position mirror 10 as desired and counteract the effect of any vibrations.

The control system of the present embodiment uses a feedback control strategy based on measuring the position of the mirror and counteracting any deviation from the desired position. The control system may in addition make use of other sensors or information from the overall control system of the lithographic apparatus to effect a feed-forward control. The set point provided by set point circuit 54 may be a constant position if the mirror 10 is a static component of the optics or may be a variable position if the mirror 10 has a role in any variable beam shaping or positioning function of the lithographic apparatus.

Embodiment 2

In a second embodiment of the invention only a position sensing system 40 as described for the first embodiment is associated with each of the reflective optical elements, such as mirrors 10, in the projection optics PL. Alternative embodiments of the positioning sensing system may only comprise absolute or only relative sensors. Changes in position and/or orientation of the various mirrors can then be monitored during operation and an imaginary error at substrate level due to such changes can be derived, since the positions and orientations of the various mirrors will be known accurately enough for such a derivation.

To correct for the derived imaginary imaging error, one (or more) of the mirrors in the projection system is (are) connected to a drive system 30 as described for the first embodiment. A control system derives a required change in the position and/or orientation of its associated mirror to correct for the various positional and/or rotational errors of all the mirrors in the projection optics PL as measured by their associated positioning sensing systems 40. To this end, raw position signals from the various position sensing systems 40 are provided to the control system. Signal processing circuits within the control system perform appropriate processing of the signals and transform them as necessary to an appropriate coordinate system for the one (or more) mirror(s) 10 connected to a drive system 30.

One may choose to provide that (those) reflective element (s) with a drive system that are most critical in their position and/or orientation of the reflective elements comprised in the projection system. Further, a position sensing system for that (those) reflective element(s) that are not critical in their position and orientation may be dispensed with.

An embodiment alternative to the second embodiment comprises a sensing system that provides for a beam of light, preferably a laser beam, passed along the various reflective elements in projection system PL from the mask towards the substrate (or vice versa). Positional and/or orientational deviations of the various reflective elements results in a change in position of the laser beam when having passed the projection system, which can be detected using an appropriate two-dimensional detector such as a four-quadrant detector (quad cell), a two-dimensional positional sensing device or a CCD camera. To provide for a continuous feedback possibility, the two-dimensional detector can be fixedly mounted on reference frame RF with respect to the projection system and the laser beam may be reflected from a position on the mask just next to its mask pattern, in which case the two-dimensional detector can be mounted out of the projection beam.

Continuous feedback of positional and rotational deviations of the reflective elements, such as in the first, second and above alternative embodiment provides for the possibility to correct for position and/or rotation changes in the high, mid and low frequency domain. In case one only is interested in deviations and correcting in the low frequency domain, such as, for instance, induced by mechanical creep of mirror mounts, it is an option to employ a two-dimensional detector mounted on the substrate table and check the position of the laser beam at selected instance in time during an imaging process. A positional error induced by positional and/or rotational deviations of the reflective elements may also be corrected for by accounting for them in the positioning of the mask and/or substrate table.

While we have described above specific embodiments of the invention, it will be appreciated that the invention may be practiced otherwise than described and the description is not intended to limit the invention. The positioning system of the present invention has been described as applied to a mirror in a lithographic projection apparatus. However, the invention may also be applied to other components of a lithographic apparatus, such as the substrate (wafer) or mask (reticle) stages, or to components of other apparatus where accurate dynamic positioning is required.

What is claimed is:

1. A lithographic projection apparatus comprising:
   an illumination system constructed and arranged to supply a projection beam of radiation;

a first object table constructed and arranged to hold a mask;

a second object table constructed and arranged to hold a substrate; and a projection system constructed and arranged to image an irradiated portion of the mask onto a target portion of the substrate, wherein at least one of said illumination system and said projection system comprises a reflective optical element and a positioner constructed and arranged to control at least one of a position and an orientation of said reflective optical element in at least two degrees of freedom.

2. The apparatus according to claim 1, wherein said reflective optical element is shaped to effect at least one of shaping and focusing of said beam of radiation.

3. The apparatus according to claim 1, wherein said positioner comprises a linear Lorentz-force actuator.

4. The apparatus according to claim 1, wherein said illumination system is adapted to supply a projection beam of radiation having a wavelength less than about 50 nm.

5. The apparatus according to claim 1, further comprising a sensor constructed and arranged to determine a change in at least one of a position and orientation of said reflective optical element with respect to a respective desired static position or orientation of said reflective optical element and wherein said positioner is configured and arranged to change said at least one of the position and orientation of said reflective optical element to correct for said determined change.

6. The apparatus according to claim 1, further comprising a sensor constructed and arranged to determine a change in at least one of a position and orientation of said reflective optical element, and to output a position signal indicative thereof; and herein said positioner includes an actuator constructed and arranged to change at least one of a position and orientation of said reflective optical element in response to a drive control signal; and a controller responsive to said position signal, said controller configured and arranged to generate said drive control signal.

7. The apparatus according to claim 6, further comprising a reference frame and wherein said sensor is constructed and arranged to determine at least one of a position and an orientation of said reflective optical element relative to said reference frame.

8. The apparatus according to claim 6, wherein said sensor includes an absolute position sensor constructed and arranged to measure at least one of a position and an orientation of said reflective optical element and to output an absolute position signal indicative thereof; and a relative position sensor constructed and arranged to measure changes in said at least one of the position and orientation of said reflective optical element and to output a relative position signal indicative thereof.

9. The apparatus according to claim 8, wherein at least one of said absolute and relative position sensors comprises a first part mounted on a reference frame and a second part mounted on said object.

10. The apparatus according to claim 8, wherein said controller is adapted to determine at least one of an initial position and orientation of said reflective optical element in response to said absolute position signal and thereafter to control at least one of a position and an orientation of said reflective optical element in response to said relative position signal.

11. The apparatus according to claim 8, wherein said relative position sensor has a higher measurement bandwidth than said absolute position sensor.

12. The apparatus according to claim 8, wherein said relative position sensor has a larger measuring range than said absolute position sensor.

13. The apparatus according to claim 8, wherein said absolute position sensor is one of a capacitive and inductive sensor.

14. The apparatus according to claim 8, wherein said relative position sensor is an interferometric sensor.

15. The apparatus according to claim 6, wherein said sensor is constructed and arranged to direct a sensing beam of radiation separate from said projection beam along said reflective optical element and to determine a position of said sensing beam after reflection by said reflective optical element.

16. The apparatus according to claim 15, further comprising a reference frame and wherein said sensor is constructed and arranged to determine at least one of a position and an orientation of said reflective optical element relative to said reference frame.

17. The apparatus according to claim 15, wherein said sensing beam is a beam of laser radiation.

18. The apparatus according to claim 15, wherein said sensor includes a two-dimensional detector arranged to determine the position of said sensing beam.

19. A lithographic projection apparatus comprising:

an illumination system constructed and arranged to supply a projection beam of radiation;

a first object table constructed and arranged to hold a mask;

a second object table constructed and arranged to hold a substrate; and a projection system constructed and arranged to image an irradiated portion of the mask onto a target portion of the substrate, wherein at least one of said illumination system and said projection system comprises a reflective optical element and a linear Lorentz-force actuator constructed and arranged to control at least one of a position and an orientation of said reflective optical element.

20. The apparatus according to claim 19, wherein said reflective optical element is shaped to effect at least one of shaping and focusing of said beam of radiation.

21. The apparatus according to claim 19, wherein said actuator is constructed and arranged to control said at least one of the position and the orientation of said reflective optical element in at least two degrees of freedom.

22. The apparatus according to claim 19, wherein said illumination system is adapted to supply a projection beam of radiation having a wavelength less than about 50 nm.

23. The apparatus according to claim 19, further comprising a sensor constructed and arranged to determine a change in at least one of a position and orientation of said reflective optical element with respect to a respective desired static position or orientation of said reflective optical element and wherein said positioner is configured and arranged to change said at least one of the position and orientation of said reflective optical element to correct for said determined change.

24. The apparatus according to claim 19, further comprising a sensor constructed and arranged to determine a change in at least one of a position and orientation of said reflective optical element, and to output a position signal indicative thereof; and wherein said positioner includes an actuator constructed and arranged to change at least one of a position and orientation of said reflective optical element in response to a drive control signal; and a controller responsive to said position signal, said controller configured and arranged to generate said drive control signal.

25. The apparatus according to claim 24, further comprising a reference frame and wherein said sensor is constructed and arranged to determine at least one of a position and an orientation of said reflective optical element relative to said reference frame.

26. The apparatus according to claim 24, wherein said sensor includes an absolute position sensor constructed and arranged to measure at least one of a position and an orientation of said reflective optical element and to output an absolute position signal indicative thereof; and a relative position sensor constructed and arranged to measure changes in said at least one of the position and orientation of said reflective optical element and to output a relative position signal indicative thereof.

27. The apparatus according to claim 26, wherein at least one of said absolute and relative position sensors comprises a first part mounted on a reference frame and a second part mounted on said object.

28. The apparatus according to claim 26, wherein said controller is adapted to determine at least one of an initial position and orientation of said reflective optical element in response to said absolute position signal and thereafter to control at least one of a position and an orientation of said reflective optical element in response to said relative position signal.

29. The apparatus according to claim 26, wherein said relative position sensor has a higher measurement bandwidth than said absolute position sensor.

30. The apparatus according to claim 26, wherein said relative position sensor has a larger measuring range than said absolute position sensor.

31. The apparatus according to claim 26, wherein said absolute position sensor is one of a capacitive and inductive sensor.

32. The apparatus according to claim 26, wherein said relative position sensor is an interferometric sensor.

33. The apparatus according to claim 26, wherein said sensor is constructed and arranged to direct a sensing beam of radiation separate from said projection beam along said reflective optical element and to determine a position of said sensing beam after reflection by said reflective optical element.

34. The apparatus according to claim 33, further comprising a reference frame and wherein said sensor is constructed and arranged to determine at least one of a position and an orientation of said reflective optical element relative to said reference frame.

35. The apparatus according to claim 33, wherein said sensing beam is a beam of laser radiation.

36. The apparatus according to claim 33, wherein said sensor includes a two-dimensional detector arranged to determine the position of said sensing beam.

37. A method of manufacturing a device comprising:
irradiating portions of a mask bearing a pattern;
imaging said irradiated portions of the mask with a projection system onto target portions of a substrate having a radiation-sensitive layer; and
controlling in at least two degrees of freedom at least one of a position and an orientation of a reflective optical element included in one of an illumination system supplying a projection beam of radiation, and the projection system.

38. The method of claim 37, wherein said controlling of at least one of the position and an orientation of said reflective optical element is performed using a linear Lorentz-force actuator.

39. The method of claim 37, wherein said reflective optical element is shaped to effect at least one of shaping and focusing of said beam of radiation.

40. The method of claim 37, wherein said illumination system is adapted to supply a projection beam of radiation having a wavelength less than about 50 nm.

41. The method of claim 37, further comprising determining a change in at least one of a position and orientation of said reflective optical element with respect to a respective desired static position or orientation of said reflective optical element; and changing said at least one of the position and orientation of said reflective optical element to correct for said determined change.

42. The method of claim 37 further comprising determining a change in at least one of a position and an orientation of said reflective optical element; outputting a position signal indicative thereof; changing at least one of a position and an orientation of said reflective optical element in response to a drive control signal; and responsive to said position signal, generating said drive control signal.

43. The method of claim 42, further comprising determining at least one of a position and an orientation of said reflective optical element relative to a reference frame.

44. The method of claim 42, wherein said determining a change in said at least one of the position and orientation of said reflective optical element includes measuring at least one of a position and an orientation of said reflective optical element and outputting an absolute position signal indicative thereof; and measuring a change in said at least one of the position and orientation of said reflective optical element and outputting a relative position signal indicative thereof.

45. The method of claim 44, comprising determining at least one of an initial position and orientation of said reflective optical element in response to said absolute position signal and thereafter to control at least one of a position and an orientation of said reflective optical element in response to said relative position signal.

46. The method of claim 44, comprising directing a sensing beam of radiation separate from said projection beam along said reflective optical element; and determining a position of said sensing beam after reflection by said reflective optical element.

47. A method of manufacturing a device comprising:
irradiating portions of a mask bearing a pattern;
imaging said irradiated portions of the mask with a projection system onto target portions of a substrate having a radiation-sensitive layer; and
controlling using a linear Lorentz-force actuator at least one of a position and an orientation of a reflective optical element included in one of an illumination system supplying a projection beam of radiation, and the projection system.

48. The method of claim 47, wherein said at least one of the position and orientation of said reflective optical element is controlled in at least two degrees of freedom.

49. The method of claim 47, wherein said reflective optical element is shaped to effect at least one of shaping and focusing of said beam of radiation.

50. The method of claim 47, wherein said illumination system is adapted to supply a projection beam of radiation having a wavelength less than about 50 nm.

51. The method of claim 47, further comprising determining a change in at least one of a position and orientation of said reflective optical element with respect to a respective desired static position or orientation of said reflective optical element; and changing said at least one of the position and orientation of said reflective optical element to correct for said determined change.

52. The method of claim 47, further comprising determining a change in at least one of a position and an orientation of said reflective optical element; outputting a position signal indicative thereof; changing at least one of a position and an orientation of said reflective optical element in response to a drive control signal; and responsive to said position signal, generating said drive control signal.

53. The method of claim 52, further comprising determining at least one of a position and an orientation of said reflective optical element relative to a reference frame.

54. The method of claim 52, wherein said determining a change in said at least one of the position and orientation of said reflective optical element includes measuring at least one of a position and an orientation of said reflective optical element and outputting an absolute position signal indicative thereof; and measuring a change in said at least one of the position and orientation of said reflective optical element and outputting a relative position signal indicative thereof.

55. The method of claim 54, comprising determining at least one of an initial position and orientation of said reflective optical element in response to said absolute position signal and thereafter to control at least one of a position and an orientation of said reflective optical element in response to said relative position signal.

56. The method of claim 54, comprising directing a sensing beam of radiation separate from said projection beam along said reflective optical element; and determining a position of said sensing beam after reflection by said reflective optical.

* * * * *